United States Patent [19]

Zingg

[11] Patent Number: 4,652,787
[45] Date of Patent: Mar. 24, 1987

[54] PIEZOELECTRIC OSCILLATOR

[75] Inventor: Walter Zingg, La Neuveville, Switzerland

[73] Assignee: Asulab S.A., Bienne, Switzerland

[21] Appl. No.: 696,366

[22] Filed: Jan. 30, 1985

[30] Foreign Application Priority Data

Feb. 15, 1984 [CH] Switzerland .................... 730/84

[51] Int. Cl.⁴ ............................................. H01L 41/08
[52] U.S. Cl. ...................................... 310/344; 310/348
[58] Field of Search ...................... 310/340, 344, 348

[56] References Cited

U.S. PATENT DOCUMENTS

| 4,110,655 | 8/1978 | Hata et al. | 310/344 |
| 4,293,986 | 10/1981 | Kobayashi et al. | 310/344 X |

FOREIGN PATENT DOCUMENTS

| 0062604 | 10/1982 | European Pat. Off. | 310/344 |
| 0629358 | 4/1982 | Switzerland | 310/344 |
| 2002955 | 2/1979 | United Kingdom | 310/344 |
| 2029092 | 3/1980 | United Kingdom | 310/344 |
| 2081007 | 2/1982 | United Kingdom | 310/344 |

Primary Examiner—Mark O. Budd
Attorney, Agent, or Firm—Pollock, Vande Sande & Priddy

[57] ABSTRACT

A piezoelectric oscillator is described comprising a piezoelectric element, e.g. a tuning fork (10), and a casing (20) formed by a pair of glass plates (22,24). The inner surfaces of the plates have recesses (26,27) that define a housing (28) in which the tuning fork (10) is located, and a pedestal (22a) to which the tuning fork (10) is secured. The inner surface of one of the plates (22) carries a conductive track (30), in the region of the pedestal (22a). This plate (22) is also formed with a hole (44) opening onto the conductive track (30) which seals it off.

20 Claims, 3 Drawing Figures

PIEZOELECTRIC OSCILLATOR

BACKGROUND OF THE INVENTION

This invention relates to piezoelectric oscillators comprising a piezoelectric element and a casing, and is more particularly concerned with an oscillator, for use in e.g. a timepiece, in which the casing includes a pair of glass plates which are sealed to one another and whose insides are formed with recesses defining a housing for the piezoelectric element and defining a pedestal for the latter.

The manufacture of such oscillators has not so far been trouble-free. Attempts to seal the two glass plates with adhesive have been unsatisfactory because the adhesives available are too permeable to maintain for long enough the vacuum required by these oscillators. Attempts have also been made to seal the two plates with a metal solder but the solder crosses a pair of electrically conductive tracks acting as terminals for the piezoelectric element, hence the need to provide intermediate insulating material of sufficient width to avoid a short-circuit through the solder, thereby substantially increasing the volume of the casing.

SUMMARY OF THE INVENTION

A main object of the invention is to reduce the cost and size of such oscillators. This object is achieved by forming in the plate with the pedestal, opposite the latter, a hole that opens onto and is sealed by one of the conductive tracks, which hole contains an electrically conductive material forming one of the terminals of the piezoelectric element.

BRIEF DESCRIPTION OF THE DRAWINGS

In the accompanying drawings given by way of example.

DETAILED DESCRIPTION

Figure 1:
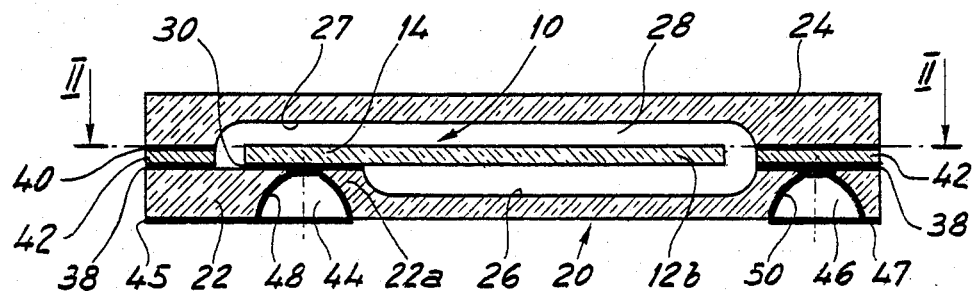
FIG. 1 is a cross-sectional view of an oscillator according to the invention.
Figure 2:
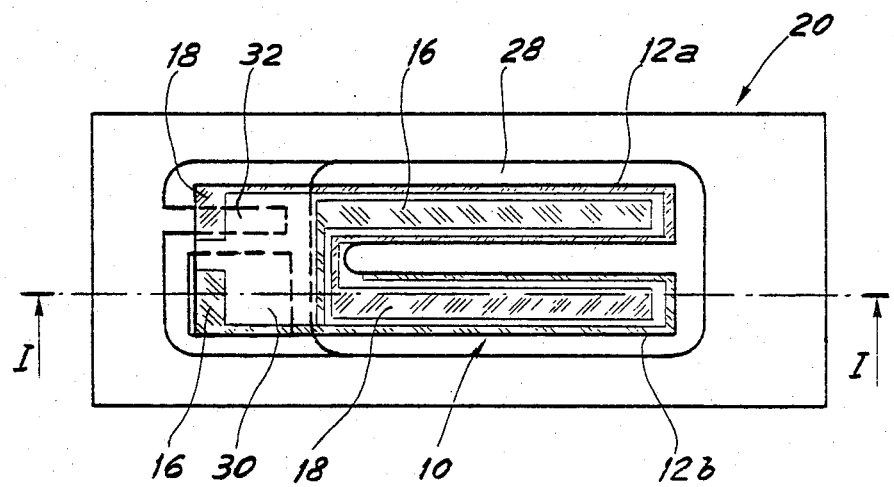
FIG. 2 is a plan view of the FIG. 1 oscillator.

The oscillator shown in FIGS. 1 and 2 comprises a piezoelectric element 10, shaped like a tuning fork, whose arms 12a and 12b and whose base 14 bear control electrodes 16 and 18. It further comprises a parallelipipedic casing 20 formed by a pair of glass plates 22 and 24. The insides of these plate have recesses 26 and 27 which together define a housing 28. Portion 22a of the inside of plate 22 provides a pedestal for the tuning fork. It bears electrically conductive tracks 30 and 32 which are electrically connected to electrodes 16 and 18 by means of two spots of electrically conductive adhesive or solder not shown. These spots further serve to fix the tuning fork, by its base 14, to pedestal 22a.

The peripheral portions of the inner surfaces of plates 22 and 24 are wholly coated by annular electrically conductive tracks 38 and 40 which lie opposite one another and are separated by a sealing frame 42, e.g. of tin alloy, which serves to connect the two plates. Track 32 is in effect an extension of annular track 38.

Lower plate 22 is formed with crater shaped holes 44 and 46, one under pedestal 22a, near one end of the plate, the other in the opposite end portion of the plate. Holes 44 and 46 are only shown in FIG. 1 so as not to clutter up FIG. 2. Holes 44 and 46 are sealed at their inner end by conductive tracks 30 and 38 and contain electrically conductive layers 48 and 50 which extend over the outer surface of plate 22 to provide supply terminals 45 and 47 for piezoelectric element 10.

Hole 46 may be formed anywhere in the area occupied by annular track 38 but is best located as far away as possible from hole 44 to reduce the risk of a short-circuit, in particular when the casing is being mounted on a printed circuit.

Figure 3:
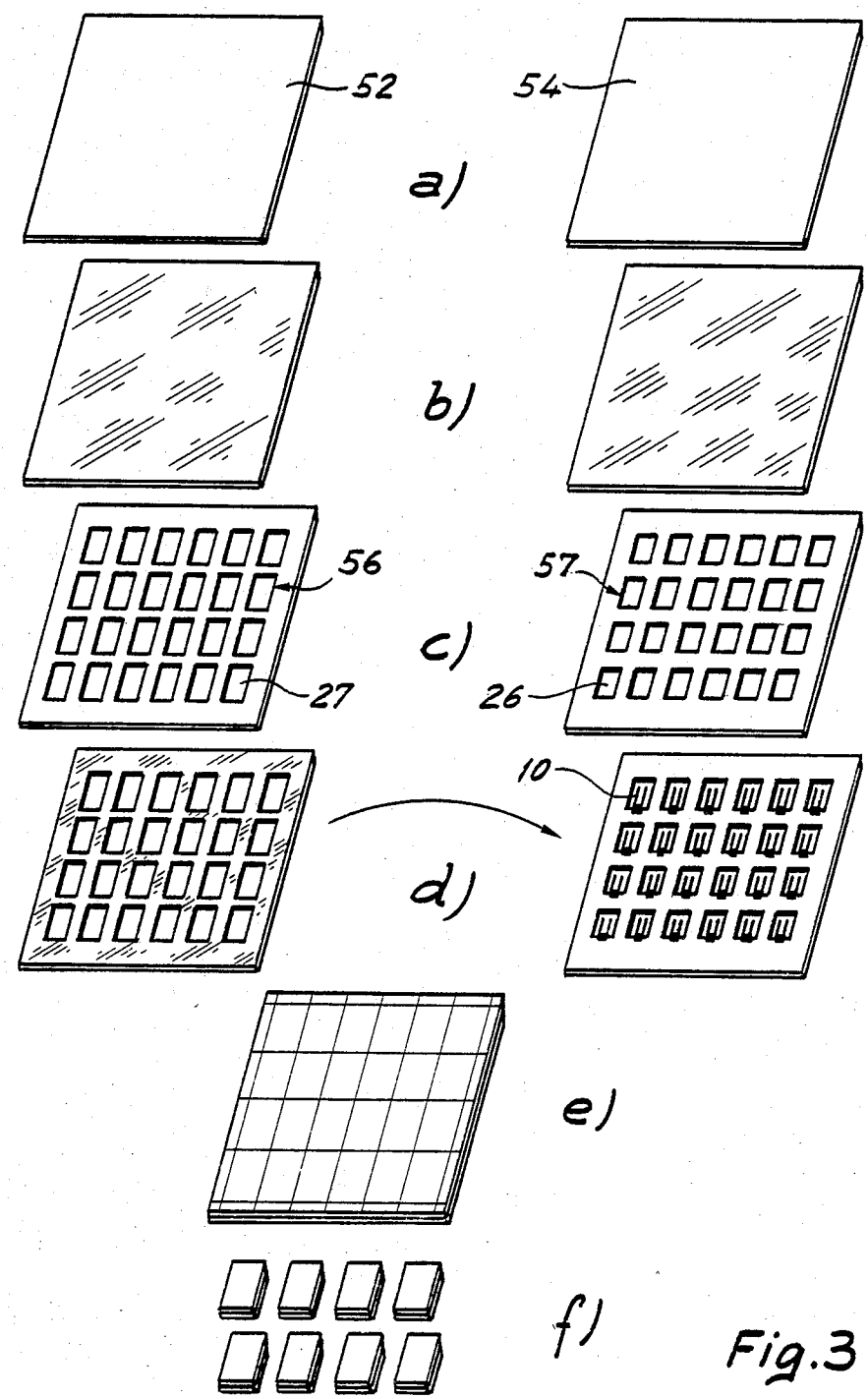
FIG. 3 illustrates diagrammatically various stages involved in the manufacture of the oscillator shown in FIGS. 1 and 2.

FIG. 3 diagrammatically illustrates various stages in one mode of manufacture of the oscillator shown in FIGS. 1 and 2. A pair of glass plates 52 and 54 (FIG. 3a), several centimetres long and wide and having the same thickness as plates 22 and 24, are metallized on both sides (FIG. 3b), first with a layer of chrome, then with a layer of gold. Plates 52 and 54 are then chemically etched (FIG. 3c) to produce alveolate structures 56 and 57, the alveoli respectively corresponding to the recesses 27 and 26 of the casing in FIG. 1. During that same operation, holes 44 and 46 (not shown in FIG. 3) are formed in plate 54. The metal layers initially deposited on the two plates are then chemically etched so as only to leave electrically conductive tracks 30, 32,38,40,45 and 47. A tuning fork 10 is then fixed, by its base 14, with adhesive to an edge portion of each alveolus 57 of plate 54 (FIG. 3d). After depositing a frame of solder (corresponding to frame 42 in FIG. 1) around each alveolus 56, the two plates are then placed on top of one another (FIG. 3e) such that each recess 47 overlies a tuning fork 10. The assembly is then heated in vacuo to soften frame 42 and sealingly to bond the plates to one another.

Once the plates have been bonded, metallic layers 48 and 50 (FIG. 1) are deposited in recesses 44 and 46. Instead, these recesses may be filled with a tin based alloy or with electrically conductive adhesive.

Both plates are then scribed (FIG. 3e) and broken along the scratched lines to separate the oscillators (FIG. 3f).

With this above described and illustrated arrangement, the risk of short-circuiting as a result of electrically conductive tracks being crossed by the sealing frame is eliminated, the size of the oscillator is reduced since the terminals are located on one of the major surfaces of the casing instead of being provided on its ends. The manufacture of the oscillator is as a result simplified firstly because no insulating material need be provided between the conductive tracks and the sealing frame, and secondly, because the two plates of the oscillator casing may be of equal length, unlike before when one plate was made longer than the other to accommodate the terminals provided at the ends of the oscillator casing, thereby enabling the steps described with reference to FIGS. 3e and 3f.

I claim:

1. A piezoelectric oscillator comprising:
   a piezoelectric element having control electrodes thereon and a fixing base at one of its ends;
   a casing including first and second glass plates each having an inner and an outer surface, said plate being sealed to one another at their inner surfaces, said inner surfaces being formed with recesses providing a housing for said element and defining an internal pedestal on the first plate supporting said element by said fixing base;

electrically conductive tracks coated on said pedestal and connected electrically to said electrodes, at least a portion of said tracks being interposed between said fixing base of said element and said pedestal; and a pair of terminals electrically connected to said tracks for connecting said tracks externally of the casing;

said first plate having a crater shaped hole chemically etched therethrough from said outer surface to said inner surface of said first plate, said hole having a first orifice in said inner surface opening onto one of said conductive tracks and a second orifice in said outer surface substantially larger than said first orifice, said housing containing a vacuum and said first orifice being covered and sealed by said one of said conductive tracks to maintain said vacuum, and said hole containing an electrically conductive material forming at least part of one of said terminals.

2. An oscillator as in claim 1, wherein the edge portion of the inner surface of each of said plates bears an annular electrically conductive track and said casing further includes a metal frame welded to said annular tracks.

3. An oscillator as in claim 2, wherein the first plate is further formed with a second hole opening on and sealed by the annular track on the first plate, said second hole containing an electrically conductive material forming at least part of the other of said terminals.

4. An oscillator as in claim 3, wherein said pedestal and the first hole are located near one end of the first plate and the second hole is formed in the opposite end portion of the first plate.

5. An oscillator as in claim 1, wherein the casing is of parallelipipedic shape.

6. An oscillator as in claim 1, wherein the electically conductive material in said hole includes a layer of gold applied to the surfaces of said hole.

7. An oscillator as in claim 1, wherein the electrically conductive material in said hole includes a tin based alloy which fills said hole.

8. An oscillator as in claim 1, wherein the electrically conductive material in said hole includes electrically conductive adhesive material which fills said hole.

9. An oscillator as in claim 3, wherein the electrically conductive material in said holes includes a layer of gold applied to the surfaces of said holes.

10. An oscillator as in claim 3, wherein the electrically conductive material in said holes includes a tin based alloy which fills said holes.

11. An oscillator as in claim 3, wherein the electrically conductive material in said holes includes electrically conductive adhesive material which fills said holes.

12. An oscillator as in claim 3, wherein both of said holes are crater shaped with their larger orifices opening in the outer surface of said first plate.

13. An oscillator as in claim 1, wherein said crater shaped hole contains a layer of electrically conductive material.

14. An oscillator as in claim 13, wherein said electrically conductive layer in said hole extends over the outer surface of said first plate to provide another part of said one of said terminals on a major surface of said casing.

15. An oscillator as in claim 12, wherein each of said crater shaped holes contains a layer of electrically conductive material, and the electrically conductive layers in said holes extend over the outer surface of said first plate to provide another part of each of said terminals on a major source of said casing.

16. An oscillator as in claim 1, wherein said crater shaped hole extends through said pedestal opposite to the fixing base of said piezoelectric element.

17. An oscillator as in claim 2, wherein said annular tracks lie substantially opposite to one another and are separated by said metal frame.

18. An oscillator as in claim 1, wherein an edge portion of the inner surface of said first plate bears an annular electrically conductive track, the other of said conductive tracks on said pedestal comprises an extension of said annular track, said first plate is formed with a second crater shaped hole opening on and sealed by said annular track, and said second crater shaped hole contains an electrically conductive material forming at least part of the other of said terminals.

19. A piezoelectric oscillator comprising:
a piezoelectric element having control electrodes thereon and a fixing base at one of its ends;
a casing including a pair of glass plates each having an inner and an outer surface, said plates being sealed to one another at their inner surfaces, said inner surfaces being formed with recesses providing a housing for said element and defining internal pedestal means supporting said element by said fixing base, and said housing containing a vacuum;
electrically conductive tracks coated on said pedestal means and connected electrically to said electrodes, at least a portion of said tracks being interposed between said fixing base of said element and said pedestal means; and
a pair of terminals electrically connected to said tracks for connecting said tracks externally of the casing;
said casing having a pair of crater shaped holes each of which is chemically etched therethrough from the outer surface to the inner surface of one of said plates and has a first orifice in the inner surface and a second orifice in the outer surface substantially larger than said first orifice,
said first orifice of one of said holes opening onto one of said conductive tracks and being covered and sealed by said one of said conductive tracks to maintain the vacuum in said housing,
the other of said conductive tracks extending along an edge portion of the inner surface of one of said plates and said first orifice of the other of said holes opening onto said other conductive track and being covered and sealed by said other conductive track to maintain the vacuum in said housing,
and each of said holes containing an electrically conductive material forming at least part of a corresponding one of said terminals.

20. A piezoelectric oscillator comprising:
a piezoelectric element having control electrodes thereon and a fixing base at one of its ends;
a casing including a pair of glass plates each having an inner and an outer surface, said plates being sealed to one another at their inner surfaces, and said inner surfaces being formed with recesses providing a housing for said element and defining internal pedestal means supporting said element by said fixing base;

electrically conductive tracks coated on said pedestal means and connected electrically to said electrodes, at least a portion of said tracks being interposed between said fixing base of said element and said pedestal means;

a pair of terminals electrically connected to said tracks for connecting said tracks externally of the casing; and, a metal frame positioned between edge portions of the inner surfaces of said glass plates;

said casing having a pair of crater shaped holes each of which is chemically etched therethrough from the outer surface to the inner surface of one of said plates and has a first orifice in the inner surface and a second orifice in the outer surface substantially larger than said first orifice, said edge portion of the inner surface of each of said plates bearing an annular electrically conductive track welded to said metal frame, said first orifice of one of said holes opening onto one of said conductive tracks on said pedestal means and being covered and sealed thereby, said one of said holes extending through said pedestal means opposite to the fixing base of said piezoelectric element, another of said conductive tracks on said pedestal means being electrically connected to one of said annular conductive tracks and said first orifice of the other of said holes opening onto one of said annular conductive tracks and being covered and sealed thereby, said other of said holes extending through one of said plates opposite to said metal frame, and each of said holes containing an electrically conductive material forming at least part of a corresponding one of said terminals.

* * * * *